VOLTAGE-VARIABLE CAPACITOR BRIDGE AMPLIFIER

Filed June 30, 1959

INVENTORS.
DON R. HOLCOMB,
DAVID B. LEESON,
BY
Noel B. Hammond
AGENT.

United States Patent Office 3,101,452

Patented Aug. 20, 1963

3,101,452

VOLTAGE-VARIABLE CAPACITOR BRIDGE AMPLIFIER

Don R. Holcomb and David B. Leeson, Los Angeles, Calif., assignors to Hughes Aircraft Company, Culver City, Calif., a corporation of Delaware Filed June 30, 1959, Ser. No. 823,879
1 Claim. (Cl. 330—10)

The present invention relates to voltage-variable capacitor circuits and, more particularly, to a bridge circuit utilizing the capacitance variation of semiconductor elements with applied potential as a balanced modulator circuit or as a variable parameter amplifier.

Heretofore, electronic circuits have often utilized active elements such as vacuum tubes or transistors to provide modulation or amplification. Vacuum tubes and transistors have several disadvantages, for example, they are relatively unstable, introduce noise into the circuit and are inefficient. Direct-coupled vacuum tube amplifiers are very unstable and are inefficient in that power is required to heat the vacuum tube cathode. A transistor amplifier cannot be connected to a signal source having a high output impedance without loading the source because transistors are low impedance devices. The input level of a transistor amplifier drifts over a period of time which is equivalent to increasing the noise introduced into the circuit.

Accordingly, it is an object of the present invention to provide a modulator or amplifier circuit which utilizes passive elements.

Another object of the invention is to provide a modulator or amplifier circuit which introduces substantially no noise.

Yet another object of the invention is to provide a modulator or amplifier circuit having a high input impedance.

An even further object of the invention is the provision of a modulator or amplifier circuit which introduces substantially no amplitude, phase, and frequency distortion.

In accordance with these and other objects of the invention, a circuit is provided which utilizes variations in the capacitance of semiconductor elements with variations in applied potential. A pair of voltage-variable capacitors having a capacitance which varies with applied potential are connected in series with the same polarity. That is, the cathode of one is connected to the anode of the other so that a potential applied from a point between the two voltage-variable capacitors and the outer ends will cause the capacitance of one to increase and the capacitance of the other to decrease. A center-tapped impedance element is connected in parallel with the series-connected voltage-variable capacitors to form a bridge circuit. An input signal source is connected in series with a load from the junction between the two voltage-variable capacitors to the center tap of the impedance element. A source of a carrier wave, or pump, is coupled to the impedance element to develop a carrier wave thereacross. By virtue of the bridge arrangement, any noise developed by the pump is canceled. The variations of the input signal cause a change in the capacitance of the voltage-variable capacitors, one increasing in capacitance and the other decreasing, causing the carrier wave to be modulated by the input signal waveform. If the circuit is balanced, the carrier wave will be suppressed at the output terminals and only the modulation sidebands will appear.

In accordance with another embodiment of the invention, a phase detector is coupled between the bridge circuit and the load to provide a reproduction of the input signal at a much lower impedance level, thus providing power amplification. The circuit is arranged so that the tapped impedance element which completes the bridge circuit of the balanced modulator also forms a part of the phase detector. That is, the carrier wave which is used as a phase reference voltage is taken from across the two halves of the tapped impedance element. This amplifier is referred to as a variable parameter amplifier.

The following specification and the accompanying drawing describe and illustrate exemplifications of the present invention. Consideration of the specification and the drawing will lead to an understanding of the invention including the novel features and objects thereof. Like reference characters are used to designate like parts throughout the figures of the drawing.

Semiconductor devices have, in addition to their unilateral conduction properties, capacitance or the ability to store an electrical charge, when they are biased to be nonconductive. At a P-N junction the density of charge carriers (electrons in the N region and holes in the P region) is reduced virtually to zero when a voltage is applied across the junction in the opposite direction from that causing easy current flow. As the voltage increases, the region of zero carrier density known as the depletion region, becomes wider. In effect, this increases the separation between the two charge-carrying areas and thereby decreases the capacitance of the semiconductor device, as though there were two metal plates separated by a dielectric whose thickness was variable. The area of the plates remains the same; the dielectric constant is unchanged; but the thickness of the dielectric varies according to the applied voltage.

For capacitor action, it may appear that the semiconductor device must always be biased so that the net voltage applied to the junction never falls to zero. It has been found, however, that when using silicon semiconductor devices, the bias can be as low as zero volts or even up to 0.4 volt in the conducting direction. Silicon devices also have extremely small leakage currents when biased to be nonconductive and have a sufficiently high Q, or figure of merit, to fulfill the requirements of nearly all capacitor applications.

Although any semiconductor devices, such as, for example, germanium diodes, may be used in circuits arranged according to the present invention, it has been found that silicon voltage-variable capacitors manufactured by Hughes Aircraft Company and bearing the type number HC7001 through HC7008 are particularly satisfactory. Silicon voltage-variable capacitors are silicon diodes which have been developed and selected for their capacitance characteristics.

Figures 1, 2:
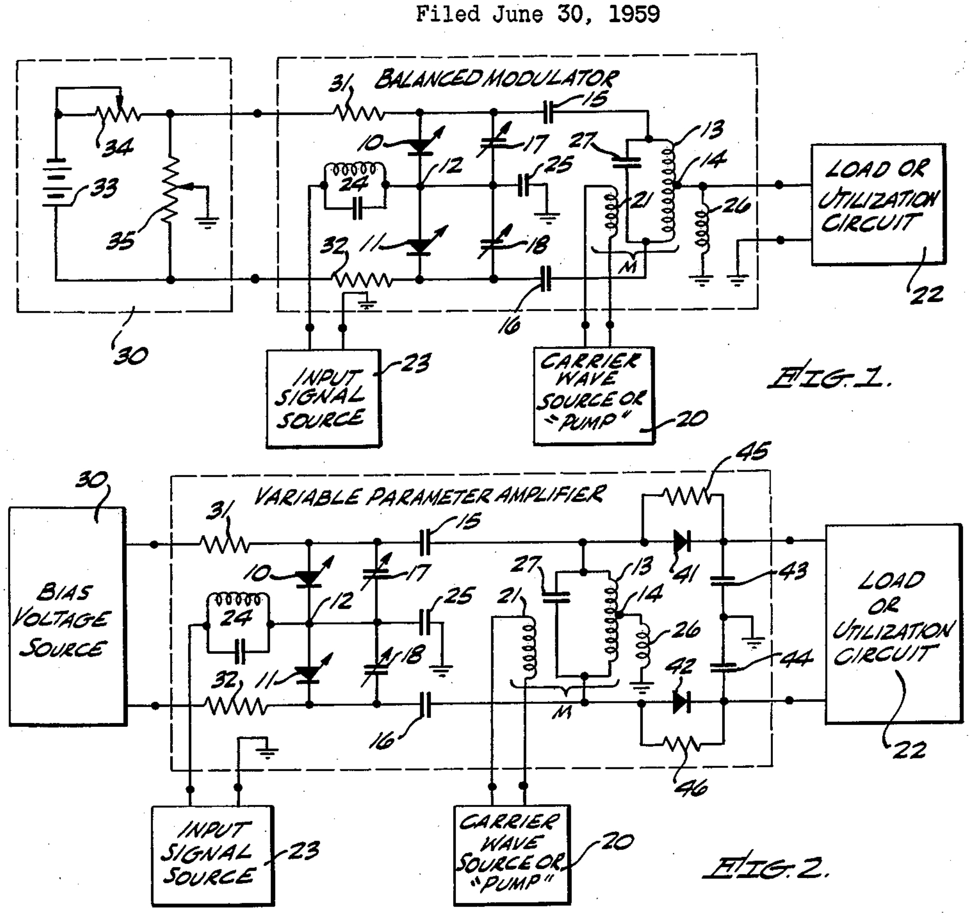
FIG. 1 is a diagram of an embodiment of a balanced modulator circuit in accordance with the invention.
FIG. 2 is a diagram of an embodiment of a variable parameter amplifier in accordance with the invention.

Referring now to FIG. 1 of the drawing, wherein there is shown a balanced modulator circuit in accordance with the invention, first and second voltage-variable capacitors 10 and 11 are provided. The voltage-variable capacitors 10 and 11 are connected in series, and with the same polarity; that is, the cathode of the first voltage-variable capacitor 10 is connected to the anode of the second voltage-variable capacitor 11 at a junction point 12. An impedance element, such as inductor 13 having a tap 14 which may be centrally disposed, is coupled in parallel with the voltage-variable capacitors 10 and 11 by means of a pair of series blocking capacitors 15 and 16. The center-tapped inductor 13 in conjunction with the voltage-variable capacitors 10 and 11 form a bridge circuit.

To balance the capacitance of the voltage-variable capacitors 10 and 11, first and second variable trimming capacitors 17 and 18 are provided, each being individually connected in parallel with one of the voltage-variable capacitors 10 and 11. More precisely, the first variable capacitor 17 is connected in parallel with the first voltage-variable capacitor 10 and the second variable capacitor 18 is connected in parallel with the second voltage-variable capacitor 11.

A carrier wave source, or pump 20, is coupled to the inductor 13 by means of a coupling coil 21, the carrier wave having a frequency which may be, for example, two megacycles per second. The carrier wave source, or pump 20, may be a conventional oscillator. When the bridge is balanced, no carrier wave voltage will appear between the junction point 12 intermediate the voltage-variable capacitors 10 and 11 and the center tap 14 of the inductor 13. Also, the balanced bridge arrangement cancels any noise developed by the carrier wave source 20.

A load or utilization circuit 22 has one side connected to the center tap 14 of the inductor 13 and the other side connected to a reference potential, hereinafter referred to as ground and so indicated in the drawing. An input signal source 23 has one side connected to ground and the other side connected through a parallel resonant circuit 24 to the junction 12 between the voltage-variable capacitors 10 and 11. Thus, the load 22, the input signal source 23, and the parallel resonant circuit 24 are connected in series across the bridge between the junction point 12 and the inductor center tap 14. A bypass capacitor 25 is connected between the junction point 12 and ground to bypass the carrier wave around the input signal source 23. The parallel resonant circuit 24 is tuned to the frequency of the carrier wave to provide a high impedance thereto and thus also serves to prevent the carrier wave flowing through the input signal source 23.

A second impedance element, such as inductor 26, is connected from the center tap 14 of the first inductor 13 to ground and thus is in parallel with the load or utilization circuit 22. The second inductor 26 may be selected or adjusted to resonate with the bypass capacitor 25 at the frequency of the carrier wave in order to provide a higher output voltage across the load or utilization circuit 22, if desired.

The bias voltage source 30 is connected to the diode capacitors 10 and 11 through a pair of series-isolation resistors 31 and 32. The bias voltage source comprises a source of potential such as a battery 33, connected in series with a voltage-dropping resistor 34. A balancing potentiometer 35 is connected in parallel with the series resistor 34 and battery 33. The center tap of the balancing potentiometer 35 is connected to ground. The bias voltage source 30 is connected with a polarity such that the voltage-variable capacitors 10 and 11 are biased to be nonconductive; that is, the cathode of the second voltage-variable capacitor 11 is connected to the positive side of the battery 33 and the anode of the first voltage-variable capacitor 10 is connected to the negative side of the battery 33. However, if the amplitude of the signals applied to the circuit is maintained sufficiently small, the bias voltage source 30 may not be necessary to maintain the voltage-variable capacitors 10 and 11 nonconductive.

The input signal may be direct current or may be alternating current having any frequency up to the point where the input capacitive reactance of the circuit becomes excessive, or to the point where the frequency of the input signal approaches the frequency of the carrier wave. A tuning capacitor 27 may be connected across the first inductor 13 and the combination may be adjusted to resonate at the frequency of the carrier wave to provide an increase in the output voltage delivered to the load or utilization circuit 22, if desired.

In operation, when the bridge is balanced, the circuit operates as a balanced modulator. Thus, the carrier wave is modulated by the input signal to develop an output signal which consists of the two modulation sidebands, the carrier wave being suppressed or eliminated. This may be seen from the waveforms shown in FIG. 3.

The carrier wave applied to the coupling coil 21 is induced into the inductor 13 by means of the mutual inductance therebetween, indicated on the drawing by the brace symbol designated M joining the coupling coil 21 and the inductor 13. The carrier wave voltage developed across the inductor 13 is applied across the series-connected voltage-variable capacitors 10 and 11 by means of the coupling capacitors 15 and 16.

Figure 3:
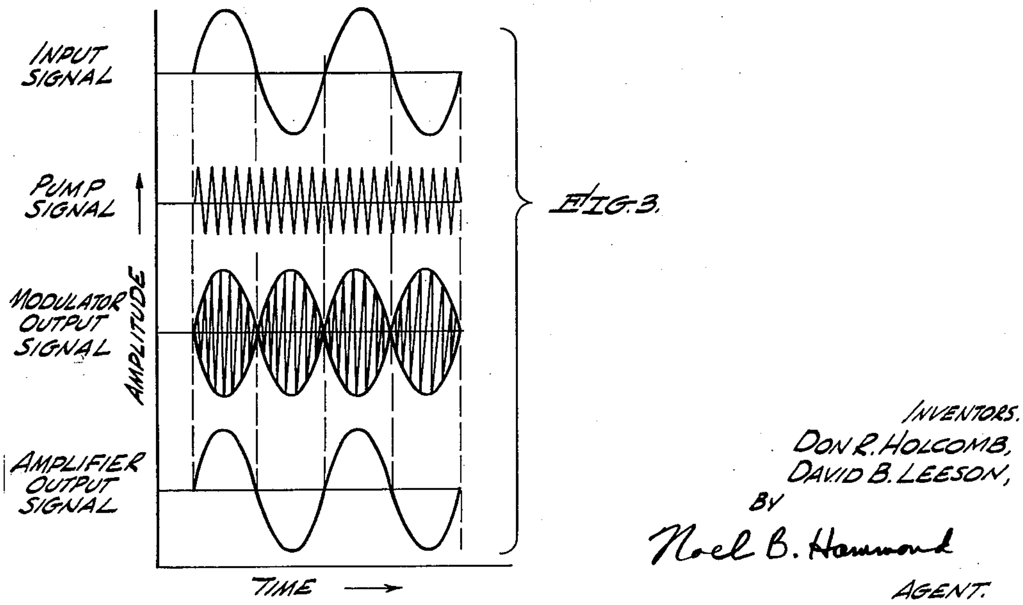
FIG. 3 illustrates waveforms of signals appearing in the circuits of FIGS. 1 and 2.

As indicated by the second waveform of FIG. 3, the carrier wave is a sine wave whose instantaneous amplitude varies at a high frequency. The capacitance of the voltage-variable capacitors 10 and 11 varies correspondingly, both increasing or both decreasing, but when the bridge is balanced and when no input signal is applied, no difference in potential appears between the junction point 12 intermediate the voltage-variable capacitors 10 and 11 and the center tap 14 of the inductor. Accordingly, no carrier wave output voltage is developed across the second inductor 26 or across the load or utilization circuit 22 connected in parallel therewith. If the bridge should be slightly unbalanced, it may be balanced by adjusting the trimming capacitors 17 and 18 and the bias balancing potentiometer 35.

When the input signal is applied between the junction point 12 and ground, it appears across the voltage-variable capacitors with opposite polarities, causing the capacitance of one to increase while the capacitance of the other decreases. Thus, the bridge is unbalanced and an output voltage appears across the load or utilization circuit 22, the input signal, shown as the first waveform of FIG. 3, modulating the amplitude of the carrier wave to develop the output voltage shown as the third waveform of FIG. 3. Because the second inductor 26 is resonant with the bypass capacitor 25 at the frequency of the carrier wave, the voltage developed across the load or utilization circuit is increased due to the resonant rise across the second inductor 26.

Referring now to FIG. 2, there is shown a variable parameter amplifier which may be the same as the balanced modulator circuit of FIG. 1 except for the addition of a phase detector. The phase detector comprises a pair of rectifiers, such as diodes 41 and 42, connected between the ends of the inductor 13 and the load or utilization circuit 22. The anode of the first diode 41 is connected to one end of the inductor 13, the cathode being connected to one end of the load or utilization circuit 22; and the anode of the second diode 42 is connected to the other end of the inductor 13, and the cathode is connected to the other end of the load or utilization circuit 22. A pair of filter capacitors 43 and 44 are connected in series across the load, their junction point being connected to ground.

A resistor 45 is connected in parallel with the first diode 41 and a resistor 46 is connected in parallel with the second diode 42. The two resistors 45 and 46 provide a discharge path for the filter capacitors 43 and 44. The inductor 13 not only forms part of the bridge circuit of the balanced modulator but also forms part of the phase detector circuit. More precisely, the output signal of the balanced modulator circuit appears across the second inductor 26 and is added in series with the carrier wave signal appearing across each half of the first inductor 13 to provide the phase reference signal for the phase detector circuit. The output signal (last waveform, FIG. 3) appearing across the load or utilization circuit 22 is a replica of the input signal (first waveform, FIG. 3) but is at a higher power level.

The voltage gain of the variable parameter amplifier herein described may be on the order of between 0.3 and 0.9 but the power gain may be on the order of 15 decibels or more. For example, a voltage of 10 millivolts provided at the input of the variable parameter amplifier at an impedance level of, for example, 100,000 ohms, may develop a voltage of almost 10 millivolts across a 10,000 ohm load. Although the values of the components used in the circuit of the present invention may be varied according to the requirements of each individual application, the following values are given by way of example as having been found satisfactory.

| | |
|---|---|
| Battery 33 | 22½ volts. |
| Isolation resistors 31 and 32 | 5.1 megohms. |
| Silicon Capacitors 10 and 11 | Hughes Aircraft Co. Type HC7005. |
| Blocking capacitors 15 and 16 | .01 microfarads. |
| Phase detector diodes 41 and 42 | 1N56A. |
| Resistors 45 and 46 | 51,000 ohms. |
| Filter capacitors 43 and 44 | 500 micromicrofarads. |

Thus, there has been described a voltage-variable capacitor bridge circuit which may be used as a balanced modulator or a variable parameter amplifier. The circuit utilizes solely passive elements, introduces substantially no noise, has a high input impedance and introduces substantially no amplitude, phase or frequency distortion.

What is claimed is:

A dielectric amplifier circuit comprising a pair of diodes having a capacitance proportional to the potential applied thereacross and being connected in series and poled in the same direction, a center-tapped first inductor coupled across said series-connected diodes through coupling capacitors, a pair of balancing capacitors coupled in series across said diodes, a carrier wave source coupled to said first inductor, an input signal source, a parallel resonant circuit tuned to the frequency of said carrier wave and connected from one side of said input signal source to the junction of said diodes, a second inductor connected from the other side of said input signal source to the tap on said first inductor, a bypass capacitor connected from the junction of said diodes to the junction between said second inductor and said input signal source and resonant with said second inductor at the frequency of said carrier wave, a source of a bias potential coupled to said diodes through isolating elements, a tuning capacitor connected across said first inductor and resonant therewith at the frequency of said carrier wave, a load, a first unilaterally conductive device connected between one end of said first inductor and one end of said load, a second unilaterally conductive device connected between the other end of said first inductor and the other end of said load, first and second resistors individually shunting said first and second devices respectively, a first filter capacitor connected from one end of said load to the junction of said second inductor and said input signal source, and a second filter capacitor connected from the other end of said load to the junction of said second inductor and said input signal source.

References Cited in the file of this patent

UNITED STATES PATENTS

| | | |
|---|---|---|
| 2,191,315 | Guanella | Feb. 20, 1940 |
| 2,470,893 | Hepp | May 24, 1949 |
| 2,608,650 | Myers | Aug. 26, 1952 |
| 2,773,946 | Greenberg et al. | Dec. 11, 1956 |
| 2,808,474 | Maynard et al. | Oct. 1, 1957 |
| 2,859,410 | Bastow | Nov. 4, 1958 |

OTHER REFERENCES

Jenkins: "Voltage-Sensitive Capacitors," Electrical Manufacturing, December 1954, pages 83–88 and 300–304.